(12) United States Patent
Lee et al.

(10) Patent No.: US 11,626,465 B2
(45) Date of Patent: Apr. 11, 2023

(54) DISPLAY DEVICE HAVING TEST PAD AND BRIDGE

(71) Applicant: SAMSUNG DISPLAY CO., LTD., Yongin-si (KR)

(72) Inventors: Ansu Lee, Yongin-si (KR); Hyungjin Song, Yongin-si (KR); Kangmoon Jo, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 204 days.

(21) Appl. No.: 16/914,558

(22) Filed: Jun. 29, 2020

(65) Prior Publication Data
US 2021/0066431 A1    Mar. 4, 2021

(30) Foreign Application Priority Data
Aug. 30, 2019  (KR) .......................... 10-2019-0107651

(51) Int. Cl.
*H01L 27/32*    (2006.01)

(52) U.S. Cl.
CPC ...... *H01L 27/3276* (2013.01); *H01L 27/3262* (2013.01)

(58) Field of Classification Search
CPC ............. H01L 27/3276; H01L 27/3262; H01L 51/0031; H01L 22/32; H01L 27/3248; H01L 51/5203; G09G 3/006
USPC ......................................................... 257/40
See application file for complete search history.

(56) References Cited

U.S. PATENT DOCUMENTS

| 9,076,980 | B2 | 7/2015 | Kang et al. | |
|---|---|---|---|---|
| 10,014,361 | B2 | 7/2018 | Choi et al. | |
| 2007/0083784 | A1* | 4/2007 | Park ................. | H01L 27/3276 713/321 |
| 2014/0217397 | A1* | 8/2014 | Kwak ................ | H01L 27/1218 257/43 |
| 2016/0372534 | A1* | 12/2016 | Lee .................... | H01L 27/3248 |
| 2018/0053816 | A1* | 2/2018 | Choi .................. | H01L 51/5253 |
| 2018/0145125 | A1* | 5/2018 | Lee .................... | H01L 51/0097 |

(Continued)

FOREIGN PATENT DOCUMENTS

| KR | 10-2013-0125294 | 11/2013 |
|---|---|---|
| KR | 10-2015-0011868 | 2/2015 |

(Continued)

*Primary Examiner* — Lex H Malsawma
*Assistant Examiner* — Laura M Dykes
(74) *Attorney, Agent, or Firm* — F. Chau & Associates, LLC

(57) ABSTRACT

A display apparatus includes a substrate with a first area and a second area outside the first area, a plurality of pixels located in the first area, a power supply line located in the second area and having a through-hole penetrating the power supply line, a first insulating layer covering the power supply line and filling the through-hole thereof, a test pad located on the first insulating layer and electrically insulated from the power supply line, wherein the test pad overlaps a region defined by the through-hole, a second insulating layer covering the test pad, and a bridge located on the second insulating layer and electrically insulated from the test pad, and electrically connected to the power supply line via a first contact hole in the first insulating layer and the second insulating layer. The test pad is disposed beneath the bridge.

21 Claims, 7 Drawing Sheets

(56) References Cited

U.S. PATENT DOCUMENTS

2018/0366494 A1* 12/2018 Lee .................... H01L 27/3276
2019/0079567 A1 3/2019 Antoniswamy et al.

FOREIGN PATENT DOCUMENTS

KR       10-1577819     12/2015
KR   10-2017-0080136    7/2017

* cited by examiner

DISPLAY DEVICE HAVING TEST PAD AND BRIDGE

CROSS-REFERENCE TO RELATED APPLICATION

This application claims priority under 35 U.S.C. § 119 to Korean Patent Application No. 10-2019-0107651, filed on Aug. 30, 2019, in the Korean Intellectual Property Office, the disclosure of which is incorporated by reference herein in its entirety.

BACKGROUND

1. Field

The present invention relates to a display apparatus, and more particularly, to a display apparatus in which a heating phenomenon in a peripheral area is reduced.

2. Description of Related Art

Generally, display apparatuses include a display area, and many pixels are located in the display area. When some of the pixels in the display area become defective pixels, quality of an image rendered by the display apparatuses may eventually deteriorate. Accordingly, a test needs to be performed on whether a defective pixel occurs in a manufacture process.

SUMMARY

In the case of a general display apparatus, a heating phenomenon occurs in a peripheral area due to a structure for testing for the occurrence of defective pixels.

In order to address several drawbacks including the aforementioned drawbacks, one or more embodiments include a display apparatus in which a heating phenomenon in a peripheral area is reduced. However, the one or more embodiments are only examples, and the scope of the present disclosure is not limited thereto.

According to an exemplary embodiment of the present invention, a display apparatus includes a substrate with a first area and a second area outside the first area, a plurality of pixels located in the first area, a power supply line located in the second area and having a through-hole penetrating the power supply line, a first insulating layer covering the power supply line and filling the through-hole thereof, a test pad located on the first insulating layer and electrically insulated from the power supply line, wherein the test pad overlaps a region defined by the through-hole, a second insulating layer covering the test pad, and a bridge located on the second insulating layer and electrically insulated from the test pad, and electrically connected to the power supply line via a first contact hole in the first insulating layer and the second insulating layer. The test pad is disposed beneath the bridge.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
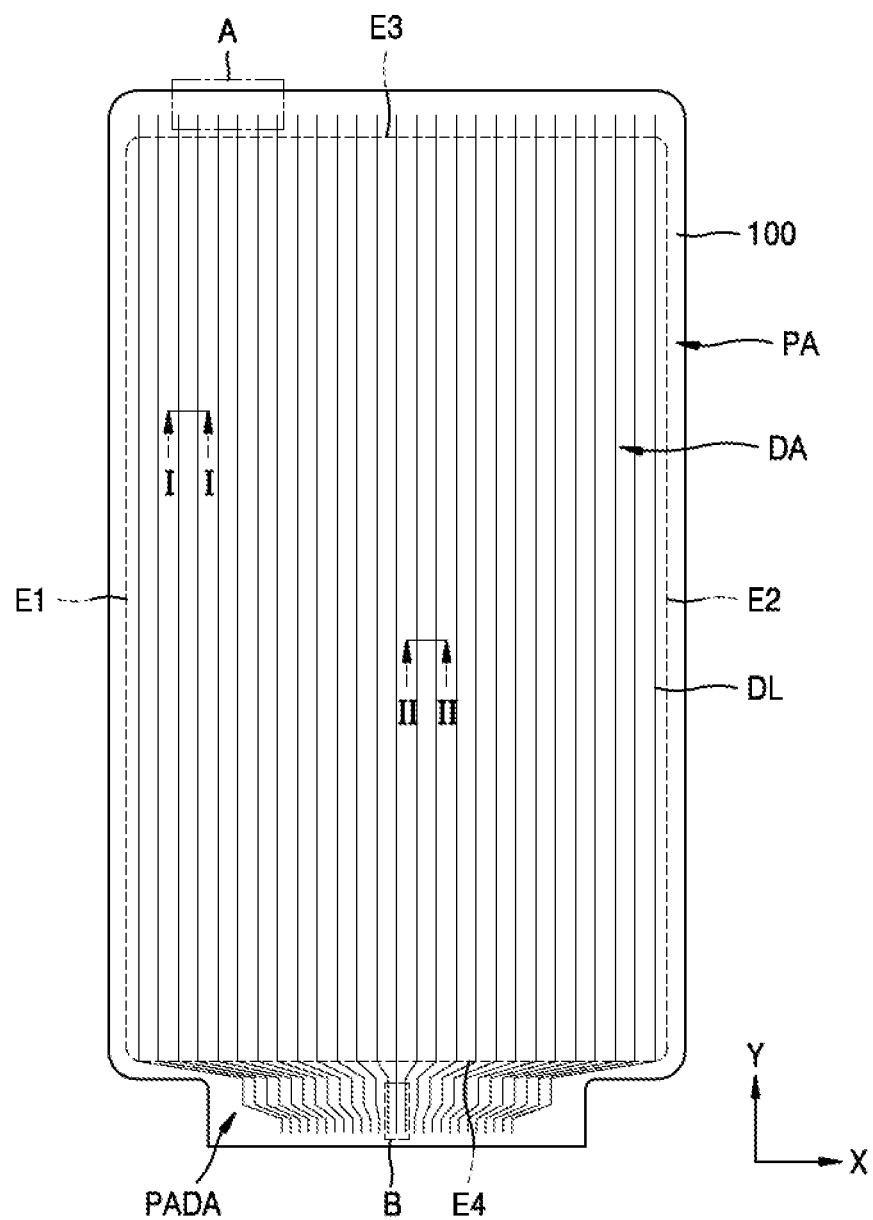
FIG. 1 is a schematic conceptual diagram of a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, embodiments will be described in detail with reference to the attached drawings. Like reference numerals in the drawings denote like elements, and thus their descriptions will not be repeated.

It will be understood that when a component, such as a layer, a film, region, or a plate is referred to as being "on," another component, the component can be directly on the other component or intervening components may be present. In addition, sizes of components in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
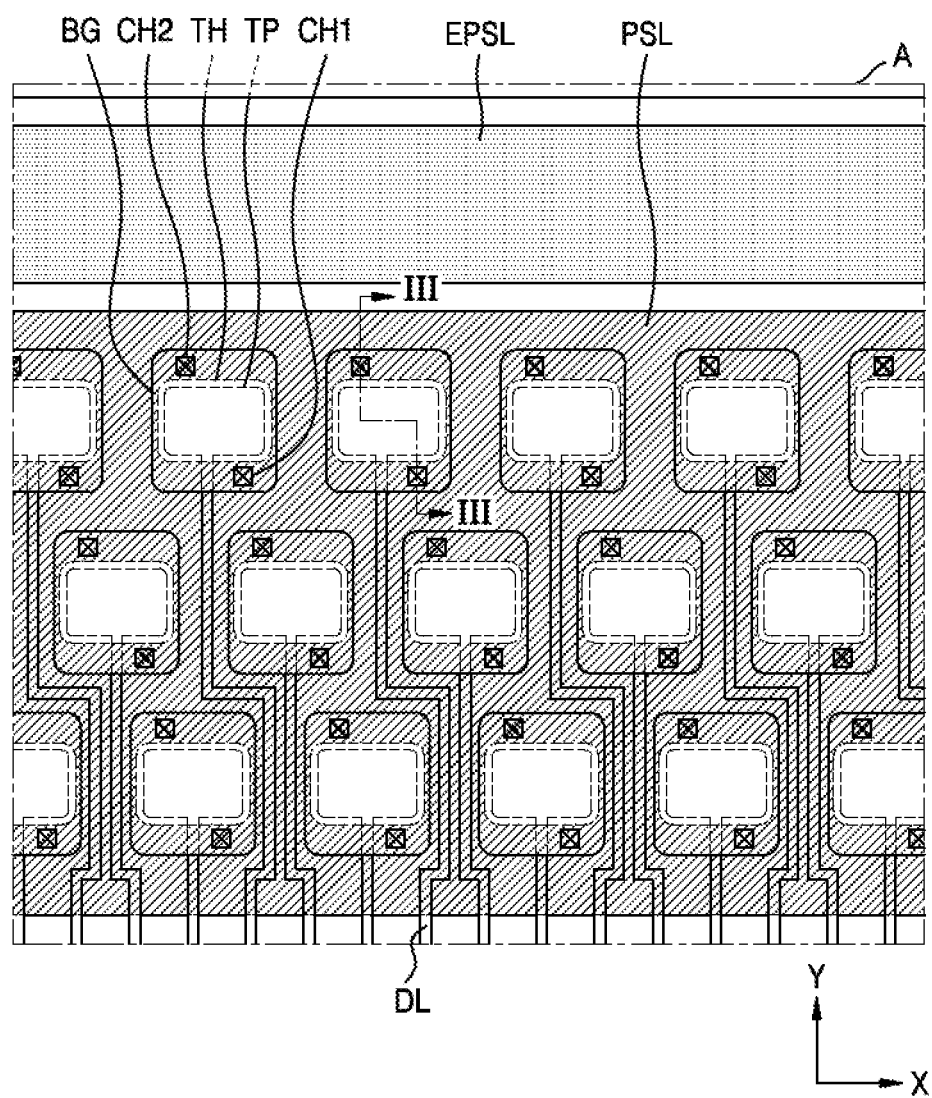
FIG. 2 is a schematic conceptual diagram of a portion A of FIG. 1.
Figure 3:
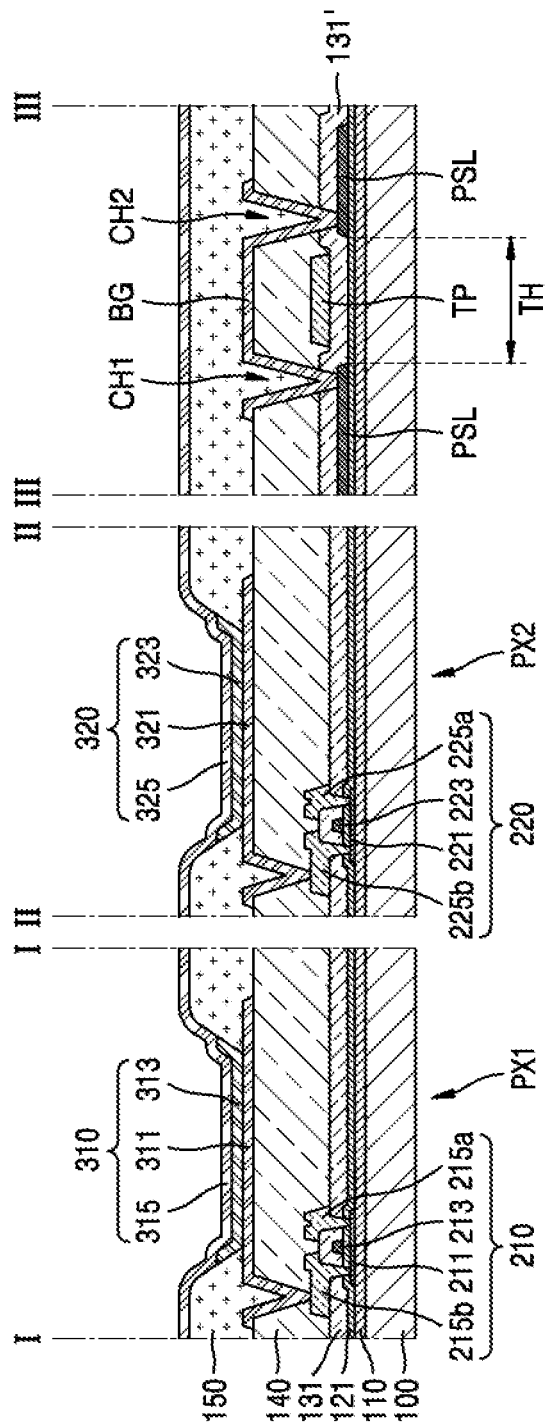
FIG. 3 is a schematic cross-sectional view of the display apparatus taken along a line III-III of FIG. 2, which also shows other portions of the display apparatus.

FIG. 1 is a schematic conceptual diagram of a portion of a display apparatus according to an embodiment. FIG. 2 is a schematic conceptual diagram of a portion A of FIG. 1. FIG. 3 is a schematic cross-sectional view of a cross-section of the display apparatus taken along a line III-III of FIG. 2, which also shows other portions of the display apparatus. That is, FIG. 3 is a cross-sectional view showing portions apart from each other in FIG. 2, and does not show elements adjacent to each other. For example, FIG. 3 illustrates a first pixel PX1 and a second pixel PX2, and the first pixel PX1 and the second pixel PX2 may not be pixels adjacent to each other. In addition, FIG. 3 is a cross-sectional view showing portions of FIG. 1 that are apart from each other. Cross-sections of the portions spaced apart from each other may not be cross-sections taken in the same direction. In an example, embodiment, the cross-sectional view of the first and second pixel PX1 and PX2 may be taken along I-I and II-II of FIG. 1 (e.g., X-axis), and the cross-sectional view of the rightmost one may be taken along III-III of FIG. 2.

As shown in FIG. 1, the display apparatus according to the present embodiment includes a display area DA in which a plurality of pixels area are located, and a peripheral area PA located outside the display area DA. This may be understood as indicating that a substrate 100 includes the display area DA and the peripheral area PA. The peripheral area PA includes a pad area PADA to which various electronic devices, a printed circuit board, etc. are electrically attached.

The substrate 100 may include glass, metal, or a polymer resin. When the substrate 100 has a flexible or bendable characteristic, the substrate 100 may include a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The substrate 100 may also include a multi-layered structure including two layers and a barrier layer arranged therebetween, wherein the two layers respectively may include the polymer resin described above and the barrier layer may include an inorganic material (such as silicon oxide, silicon nitride, silicon oxynitride, etc.). As such, the substrate 100 may be variously modified.

Edges of the display area DA may form a rectangle, a square, or a shape similar to a rectangle or a square. In detail, the display area DA may include a first edge E1 and a second edge E2 facing each other, and a third edge E3 and a fourth edge E4, both facing each other and located between the first edge E1 and the second edge E2. The pad area PADA is adjacent to the fourth edge E4 among the first to fourth edges E1 to E4.

Various signals may be applied to the display area DA. For example, a data signal, etc. for adjusting brightness in each pixel may be applied to the display area DA. To do so, as schematically illustrated in FIG. 1, various wires like a data line DL may be located inside or outside the display area DA. In addition to the data line DL, a power line (not shown), a scan line (not shown), or the like may be located inside or outside the display area DA.

As shown in portions I-I and II-II of FIG. 3 schematically illustrating a cross-section of a portion in the display area DA as shown in FIG. 1, first and second display devices 310 and 320, and first and second thin-film transistors 210 and 220 may be located in the display area DA of the substrate 100. The first and second display devices 310 and 320 may be electrically connected to the first and second thin-film transistors 210 and 220. FIG. 3 illustrates that organic light-emitting diodes as the first and second display devices 310 and 320 are located in the display area DA. The electrical connection of the organic light-emitting diodes to the first and second thin-film transistors 210 and 220 may be understood as electrical connection of first and second pixel electrodes 311 and 321 to the first and second thin-film transistors 210 and 220.

As a reference, FIG. 3 illustrates that the first thin-film transistor 210 is located in the first pixel PX1, the second thin-film transistor 220 is located in the second pixel PX2, the first display device 310 is electrically connected to the first thin-film transistor 210, and the second display device 320 is electrically connected to the second thin-film transistor 220. Hereinafter, for convenience of description, the first thin-film transistor 210 and the first display device 310 are described. This description may be also applied to the second thin-film transistor 220 and the second display device 320. That is, descriptions about a second semiconductor layer 221, a second gate electrode 223, a second source electrode 225a, and a second drain electrode 225b, each included in the second thin-film transistor 220, and descriptions about the second pixel electrode 321, an opposite electrode 325, and an intermediate layer 323, each included in the second display device 320, are omitted. As a reference, the opposite electrode 325 of the second display device 320 and the opposite electrode 315 of the first display device 310 may be formed integrally as a single body.

The first thin-film transistor 210 may include a first semiconductor layer 211 including amorphous silicon, polycrystalline silicon, or an organic semiconductor material, a first gate electrode 213, a first source electrode 215a, and a first drain electrode 215b. The first gate electrode 213 may include various conductive materials and have various layered structures. For example, the first gate electrode 213 may include a molybdenum (Mo) layer and an aluminum (Al) layer. The first source electrode 215a and the first drain electrode 215b may also include various conductive materials and have various layered structures. For example, the first source electrode 215a and the first drain electrode 215b may include a titanium (Ti) layer and an Al layer.

To ensure insulating properties between the first semiconductor layer 211 and the first gate electrode 213, a first gate insulating layer 121 may be arranged between the first semiconductor layer 211 and the first gate electrode 213. In an example embodiment, the first gate insulating layer 121 may include an inorganic material such as silicon oxide, silicon nitride, and/or silicon oxynitride, etc. In addition, a first interlayer insulating layer 131 including an inorganic material such as silicon oxide, silicon nitride, and/or silicon oxynitride, etc. may be arranged on the first gate electrode 213. The first source electrode 215a and the first drain electrode 215b may be arranged on the first interlayer insulating layer 131. An insulating layer including the inorganic material as described above may be formed by using chemical vapor deposition (CVD) or atomic layer deposition (ALD). This also applies to embodiments and modification examples to be described below.

Between the first thin-film transistor 210 and the substrate 100, a buffer layer 110 may be arranged. The buffer layer 110 may include an inorganic material such as silicon oxide, silicon nitride, and/or silicon oxynitride, etc. The buffer layer 110 may increase planarity (i.e., reduce surface roughness) of an upper surface of the substrate 100, or prevent or greatly reduce penetration of impurities from the substrate 100, etc. into the first semiconductor layer 211 of the first thin-film transistor 210.

In addition, a planarization layer 140 may be arranged on the first thin-film transistor 210. For example, as shown in FIG. 3, when an organic light-emitting diode is arranged on the first thin-film transistor 210, the planarization layer 140 may planarize an upper part of a protective layer covering the first thin-film transistor 210. The planarization layer 140 may include an organic material such as acryl, benzocyclobutene (BCB), hexamethyldisiloxane (HMDSO), or the like. FIG. 3 illustrates that the planarization layer 140 includes a single layer. However, the planarization layer 140 may include multiple layers. As such, various modifications may be made.

In the display area DA of the substrate 100, the first display device 310 may be located on the planarization layer 140. The first display device 310 may be, for example, an organic light-emitting diode including the first pixel electrode 311, the opposite electrode 315, and an intermediate layer 313 arranged therebetween and including an emission layer. As shown in FIG. 3, the first pixel electrode 311 is in contact with one selected from the first source electrode 215a and the first drain electrode 215b via an opening in the planarization layer 140, etc. to be electrically connected to the first thin-film transistor 210.

A pixel-defining layer 150 may be arranged on the planarization layer 140. The pixel-defining layer 150 may include a plurality of openings, each corresponding to one of sub-pixels and exposing at least a central portion of the first pixel electrode 311 to thereby define a pixel. In addition, in a case shown in FIG. 3, the pixel-defining layer 150 may prevent occurrence of an arc, etc. at an edge of the first pixel electrode 311 by increasing a distance between the edge of the first pixel electrode 311 and the opposite electrode 315 over the first pixel electrode 311. The pixel-defining layer 150 may include an organic material such as polyimide, HMDSO, or the like.

The intermediate layer 313 of the organic light-emitting diode may include a low-molecular weight or polymer material. When the intermediate layer 313 includes the low-molecular weight material, the intermediate layer 313 may include a single-layered or multi-layered structure in which a hole injection layer (HIL), a hole transport layer (HTL), an emission layer (EML), an electron transport layer (ETL), an electron injection layer (EIL), etc. are stacked. The intermediate layer 313 may be formed by using a vacuum deposition method. When the intermediate layer 313 includes a polymer material, the intermediate layer 313 may include a structure including an HTL and an EML. In this case, the HTL may include PEDOT, and the EML may include a polymer material such poly(phenylenevinylene) (PPV), polyfluorene, or the like. The intermediate layer 313 may be formed by using a screen printing or inkjet printing method, a laser induced thermal imaging (LITI) method, or the like. However, the intermediate layer 313 is not limited thereto, and may include various structures. In addition, the intermediate layer 313 may include a layer integrally formed as a single body over a plurality of pixel electrodes such as the first and second pixel electrodes 311 and 321. Alternatively, the intermediate layer 313 may include a layer patterned on each of the plurality of the pixel electrodes such as the first and second pixel electrodes 311 and 321.

The opposite electrode 315 is arranged in an upper part of the display area DA, and may be arranged to cover the display area DA. That is, the opposite electrode 315 may be formed integrally as a single body with respect to a plurality of organic light-emitting diodes to correspond to the plurality of pixel electrodes such as the first and second pixel electrodes 311 and 321.

The opposite electrode 315 covers the display area DA to thereby extend to the peripheral area PA outside the display area DA. In this case, an electrode power supply line EPSL (refer to FIG. 2) is located in the peripheral area PA in a direction opposite to a direction toward the display area DA with reference to a power supply line PSL that is to be described later. Thus, the opposite electrode 315 is electrically connected to the electrode power supply line EPSL in the peripheral area PA. The electrode power supply line EPSL is also referred to as ELVSS.

Since the organic light-emitting diode may be easily damaged by external moisture, oxygen, or the like, an encapsulation layer (not shown) may cover the display area DA, and thus, protect the organic light-emitting diode. In an example embodiment, the encapsulation layer may cover the display area DA and extend to at least a portion of the peripheral area PA. The encapsulation layer may include a first inorganic encapsulation layer, an organic encapsulation layer, and a second inorganic encapsulation layer, for example.

As described above, the data line DL, a power line (not shown), etc. are arranged in the display area DA of the substrate 100. Various wires, etc. may be also located in the peripheral area PA. For example, as shown in FIG. 2, the power supply line PSL, the electrode power supply line EPSL, etc. are located in the peripheral area PA. A power line (not shown) may be connected to the power supply line PSL to supply power to pixels in the display area DA. In an example embodiment, the power line, referred to as a Vdd line, may extend in a y-direction in the display area DA. For example, the power line may have a shape approximately parallel with the data line DL.

The power supply line PSL in the peripheral area PA may be formed of a same material as that of a conductive layer in the display area DA. In an example embodiment, the power supply line PSL may be formed at the same time when the conductive layer is formed. For example, as shown in FIG. 3, the power supply line PSL may be formed of a same material as that of the first gate electrode 213. The power supply line PSL may be formed at the same time when the first gate electrode 213 is formed. That is, the power supply line PSL may include a same material as a material included in the first gate electrode 213, and be located on a same layer on which the first gate electrode 213 is located. In this case, the power supply line PSL may include a same layered structure as that of the first gate electrode 213. For example, the power supply line PSL and the first gate electrode 213 may have a structure in which a first Mo layer, an Al layer, and a second Mo layer are sequentially stacked.

In this case, the first interlayer insulating layer 131 covers the first gate electrode 213. A first insulating layer 131' may cover the power supply line PSL. The first insulating layer 131' may be formed of a same material as that of the first interlayer insulating layer 131. In an example embodiment, the first insulating layer 131' may be formed at the same time when the first interlayer insulating layer 131 is formed. The first insulating layer 131' may have a shape spaced apart from the first interlayer insulating layer 131. The power line may be formed of a same material as that of the power supply line PSL. The power line and the power supply line PSL may be formed integrally as a single body. The first insulating layer 131' may also be referred to as the first interlayer insulating layer 131. This means that the first insulating layer 131' and the first interlayer insulating layer 131 may be entirely formed as a single body.

The power supply line PSL includes a through-hole TH. The through-hole TH penetrates the power supply line PSL to expose a layer (e.g., the first gate insulating layer 121) beneath the supply line. In addition, a test pad TP may be located on the first insulating layer 131' to be electrically insulated from the power supply line PSL. Here, the electrical insulation of the test pad TP from the power supply line PSL indicates that the test pad TP is not directly connected to the power supply line PSL. Thus, a device such as a thin-film transistor, etc. may be arranged between the test pad TP and the power supply line PSL.

For convenience, the power supply line PSL is illustrated in FIG. 2 by hatching. The data line DL may be located on the power supply line PSL. However, this positional relationship is not taken into consideration in FIG. 2 wherein an area of the power supply line PSL is illustrated by hatching.

The test pad TP is located on the first insulating layer 131'. Likewise, the test pad TP may be formed of a same material as a material of the first source electrode 215a, the first drain electrode 215b, the second source electrode 225a, and the second drain electrode 225b, each on the first interlayer insulating layer 131. In an example embodiment, the test pad TP may be formed on the first insulating layer 131' at the same time when the first source electrode 215a, the first drain electrode 215b, the second source electrode 225a, and the second drain electrode 225b are formed on the first interlayer insulating layer 131. Accordingly, the test pad TP may have a same layered structure as that of each of the first source electrode 215a, the first drain electrode 215b, the second source electrode 225a, and the second drain electrode 225b. For example, the test pad TP and the first source electrode 215a, the first drain electrode 215b, the second source electrode 225a, and the second drain electrode 225b may include a structure in which a first Ti layer, an Al layer, and a second Ti layer are sequentially stacked.

The test pad TP is located to correspond to the through-hole TH in the power supply line PSL. For example, the test pad TP overlaps a region defined by the through-hole TH (e.g., an outer boundary of the through-hole TH) and is disposed within the through-hole TH. In addition, the test pad TP is electrically connected to the data line DL (refer to FIGS. 1 and 2). According to cases, the test pad TP and the data line DL may be formed integrally as a single body. In addition, the data line DL and one of the first source electrode 215a and the first drain electrode 215b of the first thin-film transistor 210 may be formed integrally as a single body.

In a process of manufacturing the display apparatus, a process of inspecting whether a defect is present in a wire, an electronic device, or the like is performed. For example, in a process of manufacturing the display apparatus including a structure shown in FIG. 3, the first source electrode 215a, the first drain electrode 215b, the second source electrode 225a, the second drain electrode 225b, and the test pad TP are formed, and then, a test may be performed before the planarization layer 140 is formed. The planarization layer 140 is a second insulating layer covering the first source electrode 215a, the first drain electrode 215b, the second source electrode 225a, the second drain electrode 225b, and the test pad TP.

Since an electrical signal detected from the test pad TP corresponds to an electrical signal applied to the data line DL, when an electrical signal is not detected from a particular test pad TP, it may be determined that the data line DL connected to the test pad TP is in an open state, that is, defective. In such a case when the same electrical signal is applied to all data lines DL, when an electrical signal detected from a test pad TP among several test pads TP is different from an electrical signal detected from other test pads TP, it may be determined that the data line DL connected to the test pad TP is in a short-circuit state, that is, defective.

To inspect whether the data line DL is defective, a conductive tip of an inspection device contacts test pads TP to detect an electrical signal at each of the test pads TP. In this process, the first insulating layer 131' that is below the test pad TP is pressed. When a metal layer (or a conductive layer) is located below the test pad TP, the test pad TP may be unintentionally electrically connected to the metal layer in an inspection process because the conductive tip applies pressure to the first insulating layer 131' to thereby cause a short-circuit state between the test pad TP and the metal layer. Then, the short-circuit state is continuously maintained, and thus, cause a defect in the display apparatus. That is, a defect may occur in a process of inspecting whether the data line DL is defective.

Accordingly, to prevent occurrence of such problems in the inspection of the data line DL, the display apparatus according to the present embodiment includes the through-hole TH below the test pad TP in the metal layer located below the test pad TP. That is, since the power supply line PSL is located below the test pad TP, the power supply line PSL includes the through-hole TH and the test pad TP is located in correspondence with the through-hole TH. Thus, the test pad TP and the power supply line PSL may be effectively prevented from being in a short-circuit state in the inspection process.

In addition, an area of the test pad TP may be less than an area of the through-hole TH. A portion of the test pad TP pressed by the tip in a defect inspection process is generally a central portion of the test pad TP. However, when an edge of the test pad TP is pressed, occurrence of a short circuit between the test pad TP and the power supply line PSL due to the pressure applied by the conductive tip may need to be prevented. By making the through-hole TH to have an area greater than an area of the test pad TP, even when the edge of the test pad TP is pressed, the occurrence of a defect may be effectively prevented. Particularly, in this case, an orthogonal projection image of the through-hole TH on the substrate 100 may cover an orthogonal projection image of the test pad TP on the substrate 100. For example, an outer boundary of the through-hole TH may enclose an outer boundary of the test pad TP in a top down view of the substrate 100, for example.

As the power supply line PSL includes the through-hole TH, a resistance of the power supply line PSL may increase. Accordingly, in a process of driving the display apparatus, excessive heat may occur in the power supply line PSL. To prevent or reduce occurrence of such a problem, the display apparatus according to the present embodiment includes a bridge BG. For example, the bridge BG corresponding to the test pad TP is located on the second insulating layer covering the test pad TP, and the bridge BG electrically insulated from the test pad TP is electrically connected to the power supply line PSL via a first contact hole CH1 in the first insulating layer 131' and the second insulating layer. As such, by ensuring a moving path of an electrical signal via the bridge BG, a side effect of a resistance increase caused by the through-hole TH in the power supply line PSL may be reduced.

The bridge BG may be also electrically connected to the power supply line PSL via a second contact hole CH2 in the first insulating layer 131' and the second insulating layer (the planarization layer 140), the second contact hole CH2 being spaced apart from the first contact hole CH1. In this case, the second contact hole CH2 may be located at a position opposite to a position of the first contact hole CH1 with reference to a center of the bridge BG. By forming an electrical signal transmission path traversing the through-hole TH in the power supply line PSL via the bridge BG, a heating phenomenon in the power supply line PSL may be reduced. Here, the first contact hole CH1 may be located in a direction toward the display area DA with reference to the center of the bridge BG.

The second insulating layer described above may be formed of a same material as that of the planarization layer 140 in the display area DA. In an example embodiment, the second insulating layer may be formed at the same time when the planarization layer 140 is formed. In this case, the bridge BG may be formed of a same material as that of the first pixel electrode 311. In an example embodiment, the bridge BG may be formed at the same time when the first pixel electrode 311 is formed. Accordingly, the bridge BG may include a same layered structure as that of the first pixel electrode 311. For example, the bridge BG and the first pixel electrode 311 may have a structure in which a reflective layer such as an Al layer and a light-transmissive conductive layer including indium tin oxide (ITO), indium zinc oxide (IZO), or the like are sequentially stacked. As needed, the second insulating layer and the planarization layer 140 may be formed integrally as a single body, or the second insulating layer may be separated apart from the planarization layer 140. When the bridge BG is formed of a same material as that of the first pixel electrode 311, the bridge BG may have a same layered structure as that of the first pixel electrode 311. For example, the bridge BG and the first pixel electrode 311 may have a multi-layered structure including a reflective layer including Al, etc. and a light-transmissive conductive layer including ITO, etc. Hereafter, forming of two layers including a same material at same time indicates that the two layers have a same layered structure.

By making the bridge BG to have an area greater than an area of the test pad TP, the bridge BG may be easily electrically connected to the power supply line PSL outside the test pad TP. Particularly, in this case, an orthogonal projection image of the bridge BG on the substrate 100 may cover an orthogonal projection image of the test pad TP on the substrate 100. By doing so, the test pad TP is not exposed via the first contact hole CH1 and the second contact hole CH2. Thus, the bridge BG may be effectively prevented from being shorted with the test pad TP.

Figure 4:
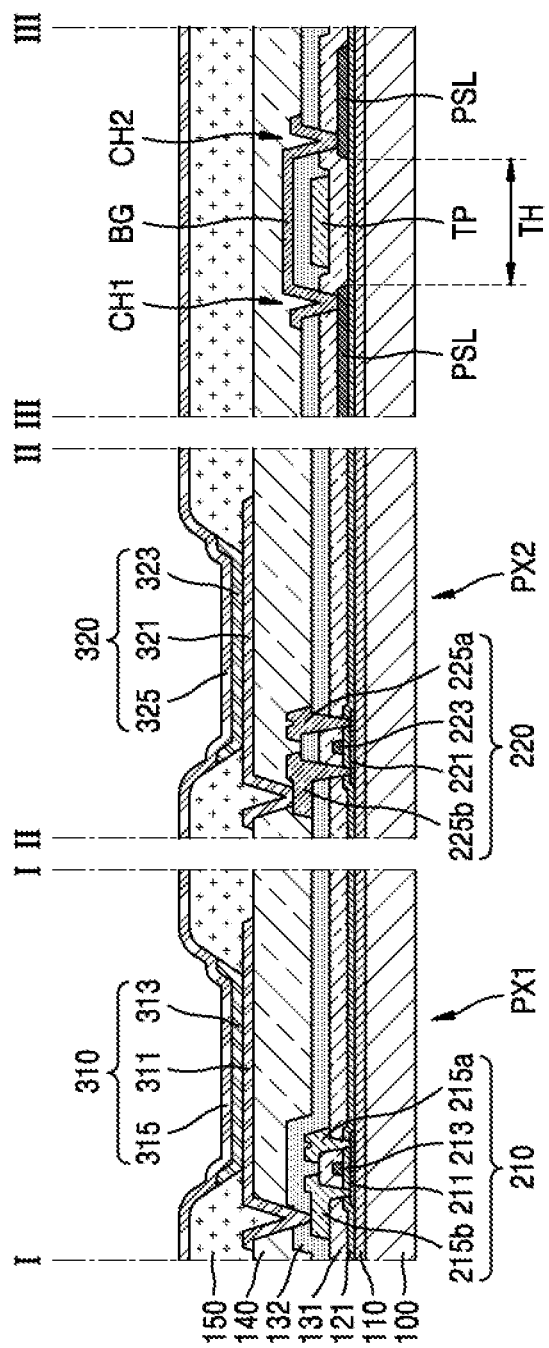
FIG. 4 is a schematic cross-sectional view of portions of a display apparatus according to another embodiment.

FIG. 4 is a schematic cross-sectional view of portions of a display apparatus according to another embodiment. Compared to the display apparatus according to the embodiment described above with reference to FIG. 3, the display apparatus according to the present embodiment is different in that the display area DA of the display apparatus according to the present embodiment further includes, in addition to the first interlayer insulating layer 131, a second interlayer insulating layer 132 covering the first source electrode 215a and the first drain electrode 215b of the first thin-film transistor 210. The second source electrode 225a and the second drain electrode 225b of the second thin-film transistor 220 are located on the second interlayer insulating layer 132, penetrating the first and second interlayer insulating layers 131 and 132. That is, the first source electrode 215a and the first drain electrode 215b, and the second source electrode 225a and the second drain electrode 225b are located on different layers, respectively.

The second interlayer insulating layer 132 extends to the peripheral area PA to cover the test pad TP located on a same layer on which the first source electrode 215a and the first drain electrode 215b are located. In addition, the bridge BG may be formed of a same material as that of the second source electrode 225a and the second drain electrode 225b. In an example embodiment, the bridge BG may be formed on the second interlayer insulating layer 132 at the same time when the second source electrode 225a and the second drain electrode 225b are formed on the second interlayer insulating layer 132. The bridge BG is located on the second interlayer insulating layer 132. That is, in this case, the second interlayer insulating layer 132 may function as the second insulating layer described above. The second interlayer insulating layer 132 may be integrally formed as a single body to correspond to not only the display area DA but also at least a part of the peripheral area PA. Alternatively, the second interlayer insulating layer 132 in the display area DA may be separated apart from the second interlayer insulating layer 132 in the peripheral area PA. The first contact hole CH1 is formed in the first interlayer insulating layer 131 and the second interlayer insulating layer 132. For example, the first contact hole CH1 penetrates the first interlayer insulating layer 131 and the second interlayer insulating layer 132 to expose a first portion of the power supply line PSL. The second contact hole CH2 is formed in the first interlayer insulating layer 131 and the second interlayer insulating layer 132. For example, the second contact hole CH2 penetrates the first interlayer insulating layer 131 and the second interlayer insulating layer 132 to expose a second portion of the power supply line PSL. Accordingly, the bridge BG on the second interlayer insulating layer 132 is electrically connected to the power supply line PSL. For example, the bridge BG connects the first and second portions of the power supply line PSL via the first and second contact holes CH1 and CH2, respectively.

FIG. 4 illustrates that the first thin-film transistor 210 is located in the first pixel PX1 and the second thin-film transistor 220 is located in the second pixel PX2. However, the present disclosure is not limited thereto. For example, not only the first thin-film transistor 210, but also the second thin-film transistor 220 may belong to one first pixel PX1. That is, with respect to the first thin-film transistor 210 and the second thin-film transistor 220, both belonging to one first pixel PX1, the first source electrode 215a and the first drain electrode 215b of the first thin-film transistor 210, and the second source electrode 225a and the second drain electrode 225b of the second thin-film transistor 220 may be located on different layers. The second pixel PX2 may also include thin-film transistors with a same structure as that of the first thin-film transistor 210 and the second thin-film transistor 220, both belonging to the first pixel PX1.

Figure 5:
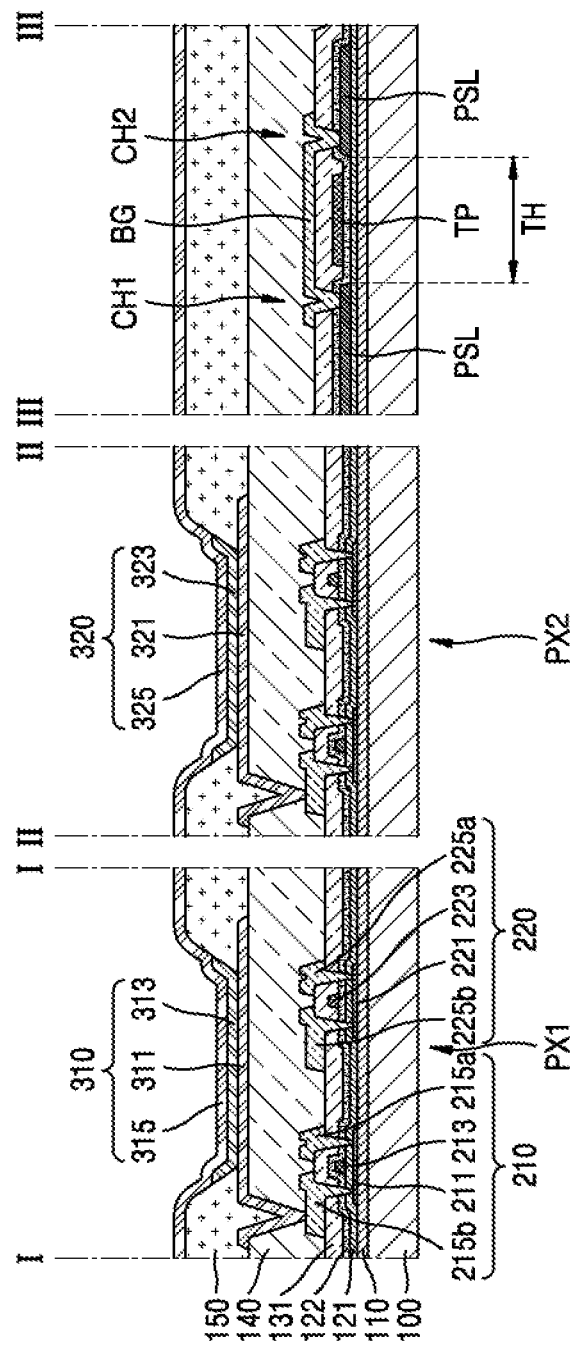
FIG. 5 is a schematic cross-sectional view of portions of a display apparatus according to another embodiment.

FIG. 5 is a schematic cross-sectional view of portions of a display apparatus according to another embodiment. Compared to the display apparatus according to the modification example of the embodiment described above with reference to FIG. 4, the display apparatus according to the present embodiment is different in that the display area DA of the display apparatus according to the present embodiment further includes, in addition to the first gate insulating layer 121, the second gate insulating layer 122 covering the first gate electrode 213 of the first thin-film transistor 210 and that the second gate electrode 223 of the second thin-film transistor 220 is located on the second gate insulating layer 122. That is, the first gate electrode 213 and the second gate electrode 223 are located on different layers. The first source electrode 215a, the first drain electrode 215b, the second source electrode 225a, and the second drain electrode 225b are located on the first interlayer insulating layer 131 covering the first gate electrode 213 and the second gate electrode 223.

In this case, the power supply line PSL is located on a same layer on which the first gate electrode 213, the test pad TP is located on a same layer on which the second gate electrode 223 is located, and the bridge BG is located on a same layer on which the first source electrode 215a, the first drain electrode 215b, the second source electrode 225a, and the second drain electrode 225b are located. In this case, the second gate insulating layer 122 may function as the first insulating layer, and the first interlayer insulating layer 131 may function as the second insulating layer. That is, the first contact hole CH1 is formed in the second gate insulating layer 122 and the first interlayer insulating layer 131, and the second contact hole CH2 is formed in the second gate insulating layer 122 and the first interlayer insulating layer 131. For example, the first and second contact holes CH1 and CH2 penetrate the second gate insulating layer 122 and the first interlayer insulating layer 131 to expose first and second portions of the power supply line PSL, respectively. Accordingly, the bridge BG on the first interlayer insulating layer 131 is electrically connected to the first and second portions of the power supply line PSL via the first and second contact holes CH1 and CH2, respectively.

Figure 6:
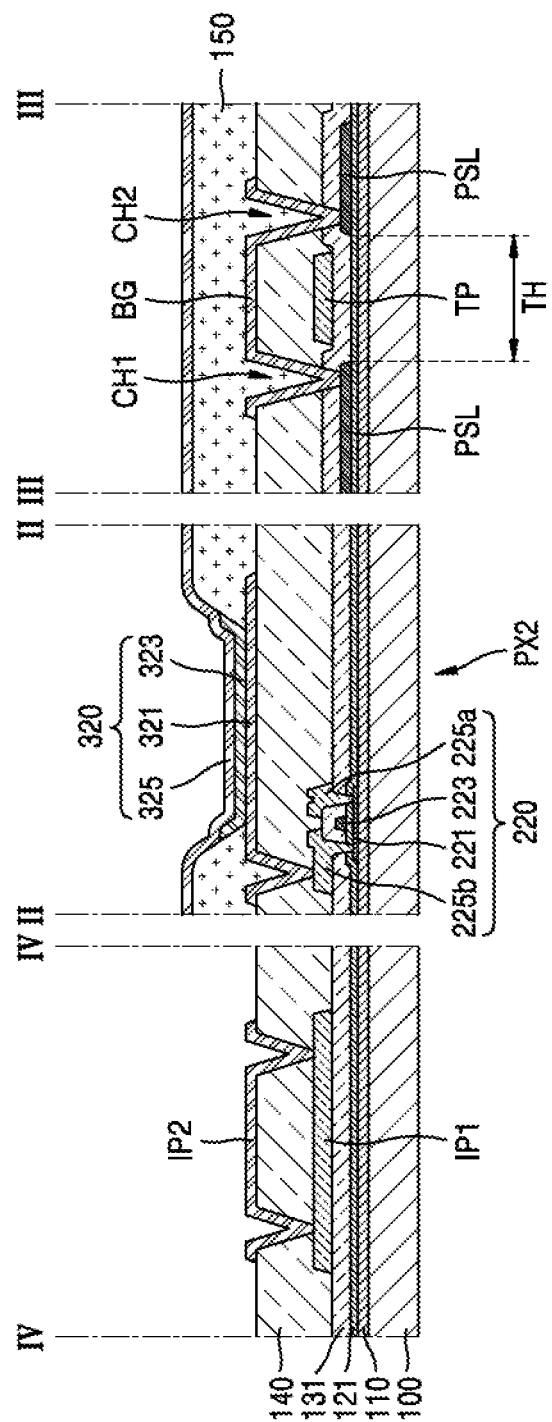
FIG. 6 is a schematic cross-sectional view of portions of a display apparatus according to another embodiment.

FIG. 6 is a schematic cross-sectional view of portions of a display apparatus according to another embodiment. A portion IV-IV of FIG. 6 corresponds to a cross-sectional view of a portion B of FIG. 1.

The display apparatus according to the present embodiment includes a first input pad IP1 and a second input pad IP2. The first input pad IP1 is located at a position in the peripheral area PA of the substrate 100 opposite to a position of the test pad TP with reference to a center of the display area DA. The first input pad IP1 is located on the first interlayer insulating layer 131. The first input pad IP1 may be formed of a same material as that of the second source electrode 225a and the second drain electrode 225b. In an example embodiment, the first input pad IP1 may be formed at the same time when the second source electrode 225a and the second drain electrode 225b are formed. That is, the first input pad IP1 may have a same layered structure as that of the second source electrode 225a and the second drain electrode 225b. The second input pad IP2 is located over the first input pad IP1 and may be electrically connected to the first input pad IP1. In this case, the bridge BG may include a same material as that included in the second input pad IP2. In an example embodiment, the bridge BG may be formed at the same time when the second input pad IP2 is formed. That is, the bridge BG may include a same layered structure as that of the second input pad IP2. FIG. 6 illustrates that the bridge BG and the second input pad IP2 are located on a same layer on which the second pixel electrode 321 is located. However, the present disclosure is not limited thereto.

In such a case when the first input pad IP1 includes a same material as that of the second source electrode 225a, when the second input pad IP2 is not present, a problem such as a damage or oxidation of the first input pad IP1 may occur before or during a process of electrically connecting an integrated circuit, a printed circuit board, or the like to the first input pad IP1. However, when the second input pad IP2 is present, since the integrated circuit, the printed circuit board, or the like is electrically connected to the second input pad IP2, such a problem may be effectively prevented. To do so, the second input pad IP2 may include ITO, or the like.

Figure 7:
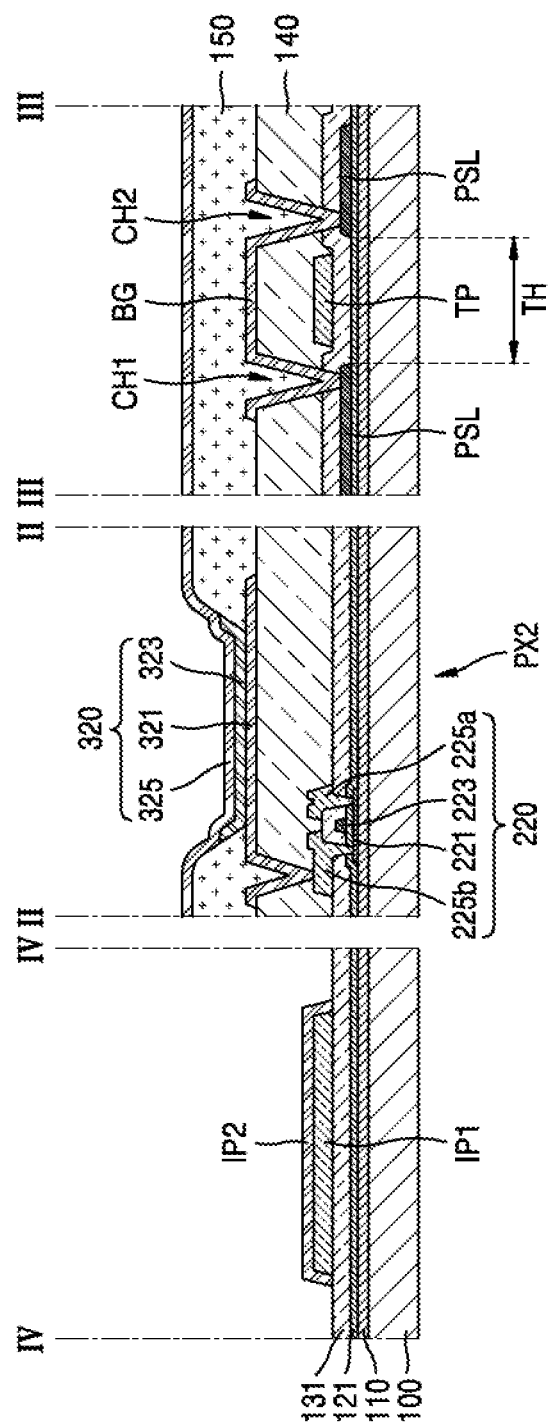
FIG. 7 is a schematic cross-sectional view of portions of a display apparatus according to another embodiment.

FIG. 6 illustrates that the second input pad IP2 is located on the planarization layer 140 and is in contact with the first input pad IP1 below the planarization layer 140 via a contact hole. However, the present disclosure is not limited thereto. For example, as shown in FIG. 7 illustrating a schematic cross-sectional view of portions of a display apparatus according to another embodiment, an insulating layer may not be present between the second input pad IP2 and the first input pad IP1, but the second input pad IP2 may cover the first input pad IP1. In this case, the second input pad IP2 may be formed of a same material as that of the bridge BR. In an example embodiment, the second input pad IP2 may be formed at the same time when the bridge BR is formed.

According to the embodiment described above, a display apparatus in which a heating phenomenon in a peripheral area is reduced may be implemented. However, such effects do not limit the scope of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
a substrate comprising a first area and a second area outside the first area;
a plurality of pixels located in the first area;
a power supply line located in the second area and having a through-hole penetrating the power supply line, wherein the through-hole exposes an inner sidewall of the power supply line such that the inner sidewall encloses the through-hole;
a first insulating layer covering the power supply line and filling the through-hole thereof;
a test pad located on the first insulating layer and electrically insulated from the power supply line, wherein the test pad overlaps a region defined by the through-hole;
a second insulating layer covering the test pad;
a bridge located on the second insulating layer and electrically insulated from the test pad, and electrically connected to the power supply line via a first contact hole in the first insulating layer and the second insulating layer, wherein the test pad is disposed beneath the bridge; and
a data line electrically connected to the test pad, wherein width of the data line is less than width of the test pad.

2. The display apparatus of claim 1,
wherein an area of the test pad is less than an area of the through-hole in a top down view.

3. The display apparatus of claim 2,
wherein an outer boundary of the through hole encloses an outer boundary of the test pad in the top down view, and
wherein the outer boundary of the through-hole corresponds to the inner sidewall of the power supply line.

4. The display apparatus of claim 1,
wherein an area of the bridge is greater than an area of the test pad in a top down view.

5. The display device of claim 4,
wherein an outer boundary of the bridge encircles an outer boundary of the test pad in the top down view.

6. The display device of claim 1,
wherein the bridge is electrically connected to the power supply line via a second contact hole in the first insulating layer and the second insulating layer, the second contact hole being spaced apart from the first contact hole.

7. The display apparatus of claim 6,
wherein the second contact hole is located at a position opposite to a position of the first contact hole with reference to a center of the bridge.

8. The display apparatus of claim 7,
wherein the first contact hole is located in a direction toward the first area with reference to the center of the bridge.

9. The display apparatus of claim 1, further comprising:
a data line traversing the first area, wherein the test pad is electrically connected to the data line.

10. The display apparatus of claim 9,
wherein the data line and the test pad are formed integrally as a single body.

11. The display apparatus of claim 9,
wherein the plurality of pixels includes a first pixel having a first thin-film transistor located in the first area,
wherein the first thin-film transistor includes a first gate electrode, a first source electrode, and a first drain electrode, and
wherein the data line and one of the first source electrode and the first drain electrode are formed integrally as a single body.

12. The display apparatus of claim 11,
wherein the power supply line comprises a same material as that of the first gate electrode, and the power supply line and the first gate electrode are located on a same layer.

13. The display apparatus of claim 11,
wherein the plurality of pixels further includes a second pixel including a second thin-film transistor located in the first area,
wherein the second thin-film transistor includes a second gate electrode, a second source electrode, and a second drain electrode,
wherein the second source electrode and the second drain electrode are located on an insulating layer covering the first source electrode and the first drain electrode, and
wherein the bridge comprises a same material as that of the second source electrode.

14. The display apparatus of claim 13,
wherein the second insulating layer covers the first source electrode and the first drain electrode, and the second source electrode and the second drain electrode are located on the second insulating layer.

15. The display apparatus of claim 1, further comprising:
a power line traversing the first area,
wherein the power supply line is electrically connected to the power line.

16. The display apparatus of claim 15,
wherein the power line and the power supply line are formed integrally as a single body.

17. The display apparatus of claim 1,
wherein the plurality of pixels includes a first pixel with a pixel electrode located in the first area,
wherein the bridge comprises same material as the pixel electrode.

18. The display apparatus of claim 17,
wherein the bridge has a same layered structure as the pixel electrode.

19. The display apparatus of claim 17,
wherein the second insulating layer is disposed in the first area and the second area, and
wherein the pixel electrode is located on the second insulating layer.

20. The display apparatus of claim 1, further comprising:
a first input pad located at a position in the second area opposite to a position of the test pad with reference to a center of the first area; and
a second input pad on the first input pad,
wherein the bridge comprises a same material as the second input pad.

21. The display apparatus of claim 1, further comprising:
an electrode power supply line located in the second area to be located at a position opposite to the first area with reference to the power supply line,
wherein an opposite electrode in the first area extends to the second area to be electrically connected to the electrode power supply line.

* * * * *